(12) United States Patent
Saito et al.

(10) Patent No.: US 8,186,380 B2
(45) Date of Patent: May 29, 2012

(54) DECOMPRESSION APPARATUS AND INORGANIC POROUS BODY

(75) Inventors: Norihiko Saito, Kanagawa (JP); Sotaro Takeda, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 968 days.

(21) Appl. No.: 12/177,630

(22) Filed: Jul. 22, 2008

(65) Prior Publication Data

US 2009/0032127 A1 Feb. 5, 2009

(30) Foreign Application Priority Data

Jul. 23, 2007 (JP) .............................. P. 2007-190462
Oct. 26, 2007 (JP) .............................. P. 2007-279283

(51) Int. Cl.
*F16L 53/00* (2006.01)
(52) U.S. Cl. ......... 137/599.14; 137/565.23; 137/601.18; 138/42
(58) Field of Classification Search ............... 137/544, 137/549, 550, 565.23, 599.01, 599.14, 601.18; 138/41, 42; 210/459; 73/865.8; 257/E21.001
See application file for complete search history.

(56) References Cited

U.S. PATENT DOCUMENTS

| | | | | |
|---|---|---|---|---|
| 619,569 A | * | 2/1899 | Hewel ........................... | 210/458 |
| 3,838,557 A | * | 10/1974 | McGuire ..................... | 55/385.4 |
| 5,181,532 A | * | 1/1993 | Brodefors et al. .............. | 137/14 |
| 5,357,793 A | * | 10/1994 | Jouwsma ......................... | 73/202 |
| 5,623,958 A | * | 4/1997 | Bumpers ........................ | 137/269 |
| 5,974,809 A | * | 11/1999 | Wooster et al. ................ | 62/55.5 |
| 6,269,835 B1 | * | 8/2001 | Kochsmeier ................... | 137/549 |
| 2002/0053762 A1 | * | 5/2002 | Semerdjian .................... | 264/629 |
| 2003/0221496 A1 | * | 12/2003 | Cross et al. ................... | 73/865.8 |
| 2005/0034767 A1 | * | 2/2005 | Reimer et al. ........... | 137/565.23 |
| 2008/0163950 A1 | * | 7/2008 | Andersen et al. .............. | 138/39 |
| 2010/0263758 A1 | * | 10/2010 | Young .............................. | 138/30 |
| 2010/0288369 A1 | * | 11/2010 | Chang et al. .................... | 137/12 |

FOREIGN PATENT DOCUMENTS

| | | |
|---|---|---|
| EP | 0 189 279 B1 | 10/1991 |
| JP | 61-228648 A | 10/1986 |
| JP | 7-235497 A | 9/1995 |
| JP | 2002-336632 A | 11/2002 |
| KR | 2004-0054839 A | 6/2004 |

* cited by examiner

*Primary Examiner* — John Rivell
*Assistant Examiner* — Matthew W Jellett
(74) *Attorney, Agent, or Firm* — Foley & Lardner LLP

(57) ABSTRACT

A decompression apparatus has an exhaust mechanism for decompressing a vacuum chamber. The exhaust mechanism has a main exhaust passage one end of which is connected to the vacuum chamber and the other end of which is connected to a vacuum pump, a first valve disposed in the main exhaust passage; a slow exhaust passage one end of which is connected to the vacuum chamber directly or via part of the main exhaust passage and the other end of which is connected to the vacuum pump directly or via part of the main exhaust passage, a cylindrical inorganic porous body disposed in the slow exhaust passage so that a gap is formed between the inorganic porous body and the inner surface of the slow exhaust passage, and a second valve disposed in the slow exhaust passage.

6 Claims, 9 Drawing Sheets

DECOMPRESSION APPARATUS AND INORGANIC POROUS BODY

BACKGROUND OF THE INVENTION

1. Field of the Invention

The present invention relates to a decompression apparatus and an inorganic porous body used therein. More particularly, the invention relates to a decompression apparatus having an exhaust mechanism which incorporates a cylindrical inorganic porous body therein and an inorganic porous body used therein.

2. Related Art

In conventional manufacturing processes of a semiconductor wafer or a liquid crystal material, a vacuum chamber which is used as part of a dry etching apparatus, a sputtering apparatus, a CVD apparatus, a heat treatment furnace, or the like has a slow exhaust passage parallel to a main exhaust passage for buffering the pressure at the time of exhausting under various conditions such as a low pressure or a gas atmosphere having a different composition than air.

As shown in FIG. 8, a conventional decompression apparatus 31 has an exhaust mechanism 33 for decompressing a vacuum chamber 32. The exhaust mechanism 33 has a main exhaust passage 37. One end of the main exhaust passage 37 is located in the vacuum chamber 32 and is connected to an exhaust opening 35 to which a plate-like alumina filter is attached. The other end of the main exhaust passage 37 is connected to a vacuum pump 36. The exhaust mechanism 33 further has a first opening/closing valve (main valve) 38 which is disposed in the main exhaust passage 37, a slow exhaust passage 39 one end of which is connected to the vacuum chamber 32 directly or via the main exhaust passage 37 and other end of which is connected to the vacuum pump 36 via the main exhaust passage 37, and a second opening/closing valve (slow exhaust valve) 40 which is disposed in the slow exhaust passage 39 and is made parallel to the first opening/closing valve 38.

In the conventional decompression apparatus 31, exhausting is performed slowly through the slow exhaust passage 39 at an initial stage and then very fast through the main exhaust passage 37.

However, when exhausting through the plate-like alumina filter 34, because the pore diameters of a porous body (the alumina filter) is small, the exhausting rate is extremely low.

FIG. 9 shows another conventional decompression apparatus 41. In this decompression apparatus, a slow exhaust opening 42 equipped with a plate-like alumina filter 34 is provided separately from an exhaust opening 35 for increasing the exhaust rate. However, modifying the apparatus in this manner requires high cost.

On the other hand, a method using a metallic mesh filter instead of the plate-like alumina filter provides such advantages that an influence on the exhaust time is small due to a large mesh size and that the filter can be attached to the exhaust opening in the apparatus without modifying the apparatus. However, such the method shows a small effect of suppressing stirring-up of particles.

Further, there have been proposed a wafer handling system which has a main exhaust passage that communicates with a vacuum chamber and a vacuum pump and a slow exhaust passage that is parallel to the main exhaust passage (refer to Japanese Unexamined Patent Publication JP-A-61-228648, for example) and a horizontal processing furnace having a variable conductance valve disposed in a slow exhaust passage (refer to Japanese Unexamined Patent Publication JP-A-7-235497, for example).

SUMMARY OF THE INVENTION

The present invention has been made in view of the above circumstances, and an object of the invention is to provide a decompression apparatus which is low in cost, provides a high exhaust rate, and can prevent stirring-up of particles as well as an inorganic porous body used therein.

To attain the above object, according to an aspect of the invention, there is provided a decompression apparatus including:

a vacuum chamber and an exhaust mechanism which decompresses the vacuum chamber and including:

a main exhaust passage one end of which is connected to the vacuum chamber and the other end of which is connected to a vacuum pump;

a first valve provided in the main exhaust passage;

a slow exhaust passage one end of which is connected to the vacuum chamber directly or via part of the main exhaust passage and the other end of which is connected to the vacuum pump directly or via part of the main exhaust passage;

a cylindrical inorganic porous body provided in the slow exhaust passage so that a gap is formed between the inorganic porous body and an inner surface of the slow exhaust passage; and a second valve provided in the slow exhaust passage.

According to another aspect of the invention, there is provided a cylindrical inorganic porous body which disposed in an exhaust mechanism, for decompressing a vacuum chamber, of a decompression apparatus.

According to the present invention, a decompression apparatus, which is low in cost, provides a high exhaust rate, and can prevent stirring-up of particles, and an inorganic porous body used therein are provided.

DETAILED DESCRIPTION OF THE PREFERRED EMBODIMENTS

A decompression apparatus according to a first embodiment of the present invention will be hereinafter described with reference to the accompanying drawings.

Figure 1:
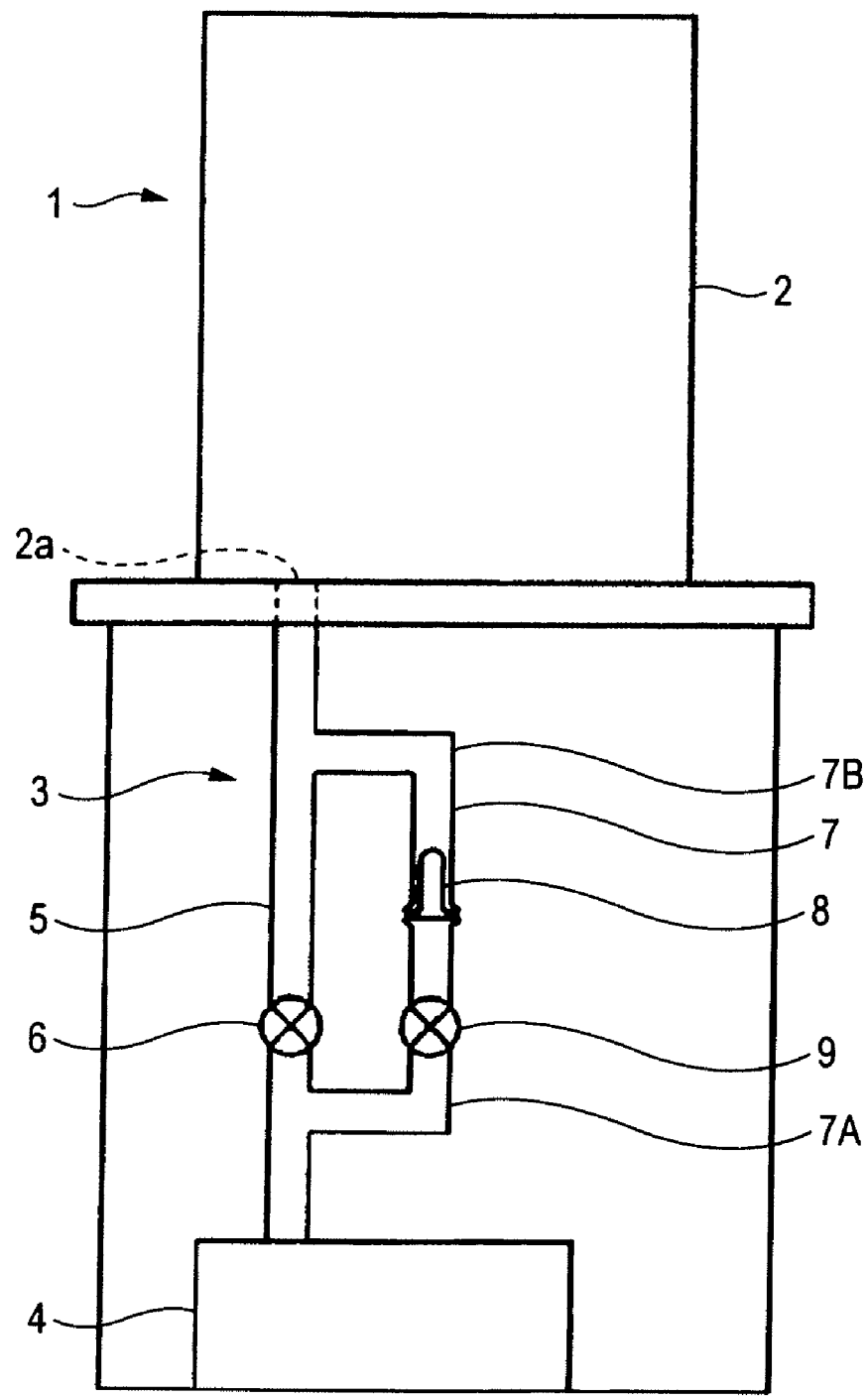
FIG. 1 is a conceptual diagram of a decompression apparatus according to a first embodiment of the present invention.
Figure 2:
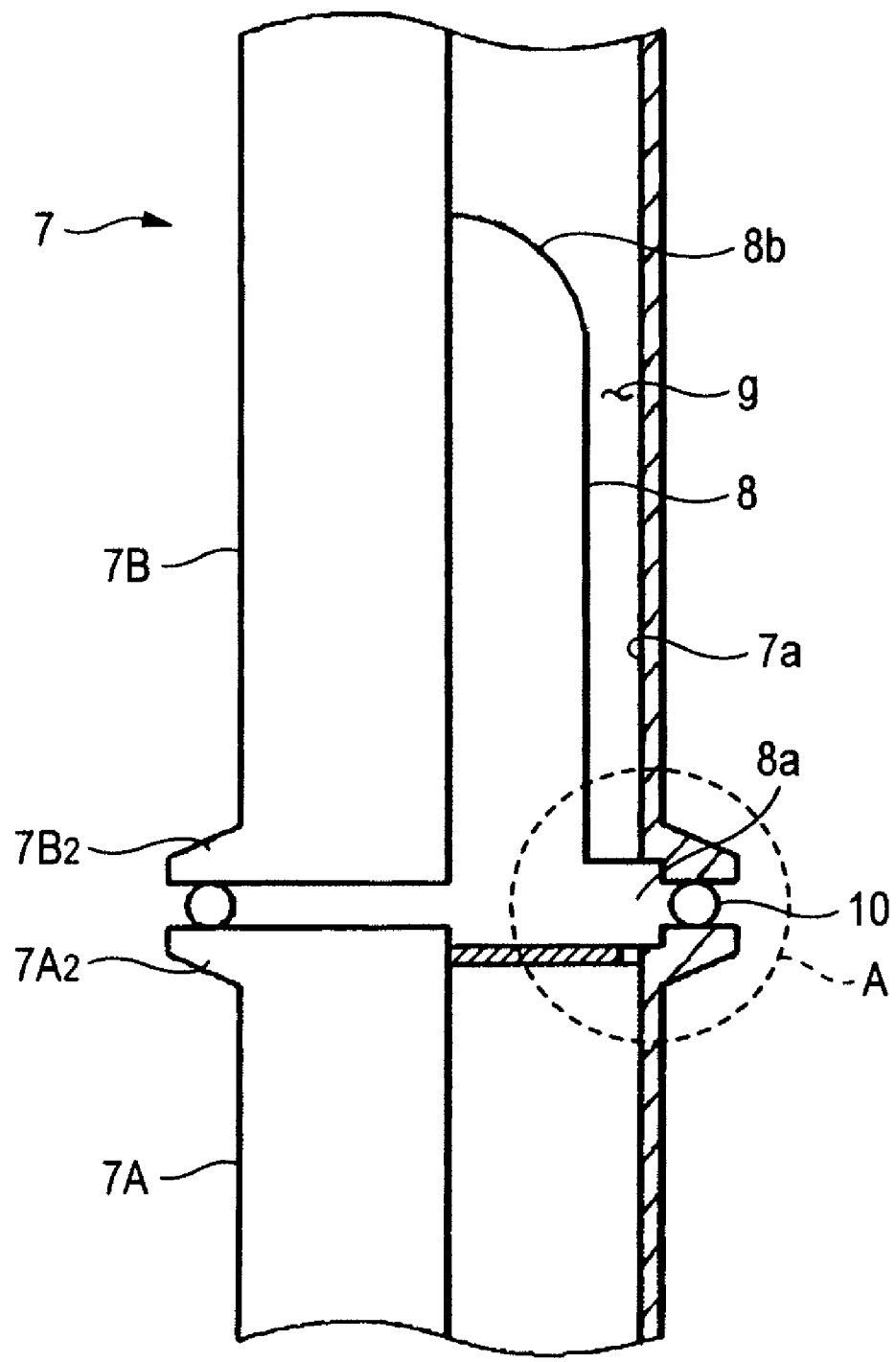
FIG. 2 is an enlarged view of an inorganic porous body attaching portion of the decompression apparatus according to the first embodiment of the invention.

FIG. 1 is a conceptual diagram of a decompression apparatus according to the first embodiment of the invention. FIG. 2 is an enlarged view of an inorganic porous body attaching portion of the decompression apparatus.

As shown in FIG. 1, the decompression apparatus 1 according to the first embodiment of the invention has a vacuum chamber 2 (processing chamber) which is to be decompressed to vacuum. The vacuum chamber 2 has an exhaust mechanism 3 for decompressing the vacuum chamber 2 to vacuum.

The exhaust mechanism 3 has:
a main exhaust passage 5 one end of which is connected to the vacuum chamber 2 via an exhaust opening 2a formed at a bottom of the vacuum chamber 2 and the other end of which is connected to a vacuum pump 4,
a first valve (main valve) 6 disposed in the main exhaust passage 5,
a slow exhaust passage 7 one end of which is connected to the vacuum chamber 32 via the main exhaust passage 5 and other end of which is connected to the vacuum pump 36 via the main exhaust passage 5,
an inorganic porous body 8 disposed in the slow exhaust passage 7 and
a second valve (slow exhaust valve) 9 disposed at a downstream side of the slow exhaust passage 7 relative to the inorganic porous body 8.

As shown in FIG. 2, the inorganic porous body 8 is a silica porous body and is a bottomed cylindrical shape having a bottom portion 8b at one axial end and an opening portion at the other axial end. A gas-nontransmissive ring-shaped flange 8a, which is made of the same material as the inorganic porous body 8, is monolithically formed with the inorganic porous body 8 at the opening portion side of the inorganic porous body 8.

Figure 3:
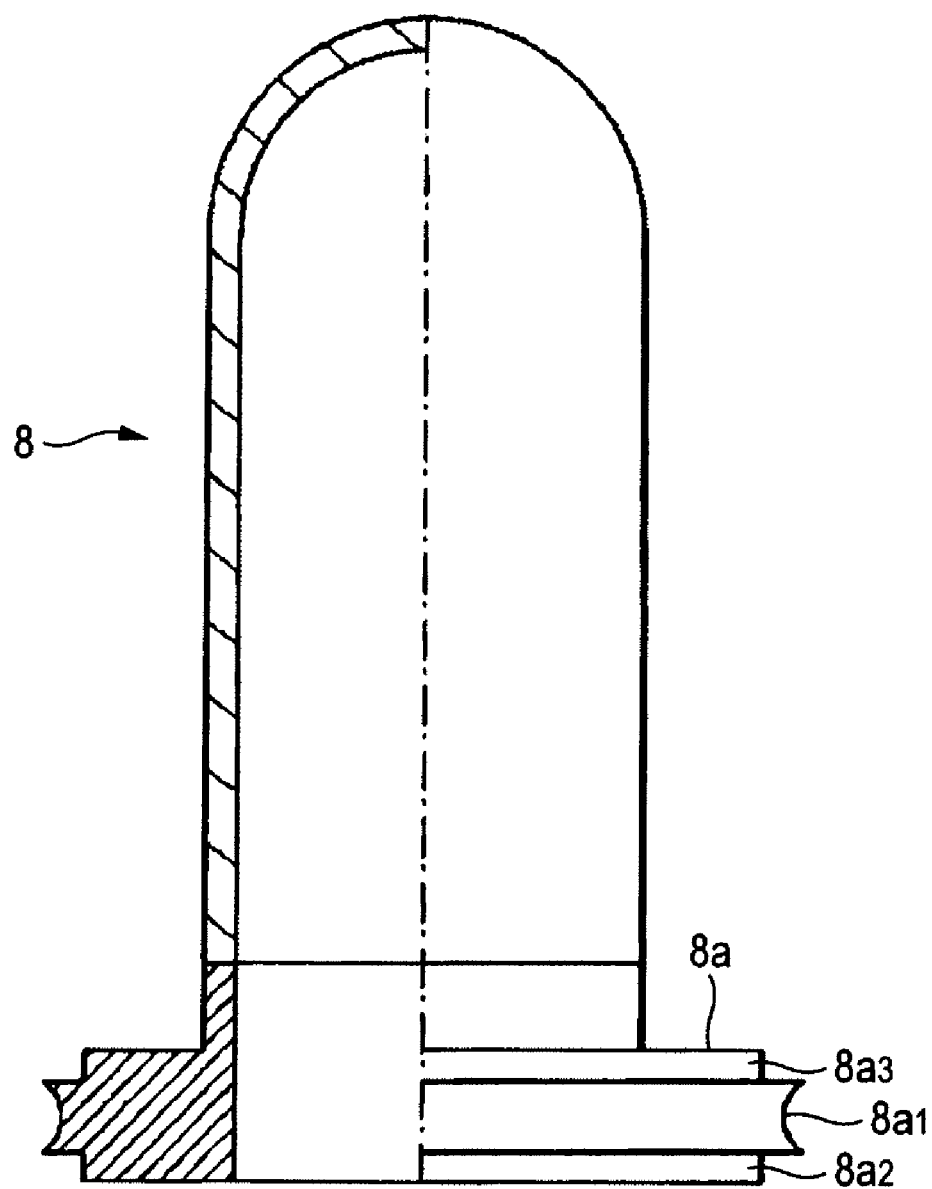
FIG. 3 is a vertical sectional view of an inorganic porous body which is used in the decompression apparatus according to the first embodiment of the invention.

As shown in FIGS. 2 and 3, the inorganic porous body 8 is disposed inside the slow exhaust passage 7 so that the substantially semi-spherical bottom portion 8b of the inorganic porous body 8 is located on the upstream side (that is, on the side of the vacuum chamber 2) and that a gap "g" is formed between the inorganic porous body 8 and a slow exhaust passage wall 7a.

For example, when setting the inner diameter of the slow exhaust passage 7 as 100 mm and the outer diameter of the inorganic porous body 8 as 60 to 80 mm, the gap "g" becomes 10 to 20 mm. Further, it is preferable that an average pore diameter (according to JIS R1643, 1998) is 10 to 100 μm and the porosity of the inorganic porous body 8 is 20 to 70%.

As described above, since the inorganic porous body 8 is a bottomed cylindrical shape, its surface area for gas passage is increased accordingly (that is, gas-contacting area is enlarged).

Furthermore, when the average pore diameter is set to be a range from 10 to 100 μm and the porosity of the inorganic porous body 8 is set to be a range from 20 to 70%, the longitudinal center axes of the slow exhaust passage 7 and the inorganic porous body 8 are made aligned with each other, and the ratio of the outer diameter of the inorganic porous body 8 to the inner diameter of the slow exhaust passage 7 is set to be 60 to 80%, fast decompression can be performed while avoiding abrupt decompression.

Figure 4:
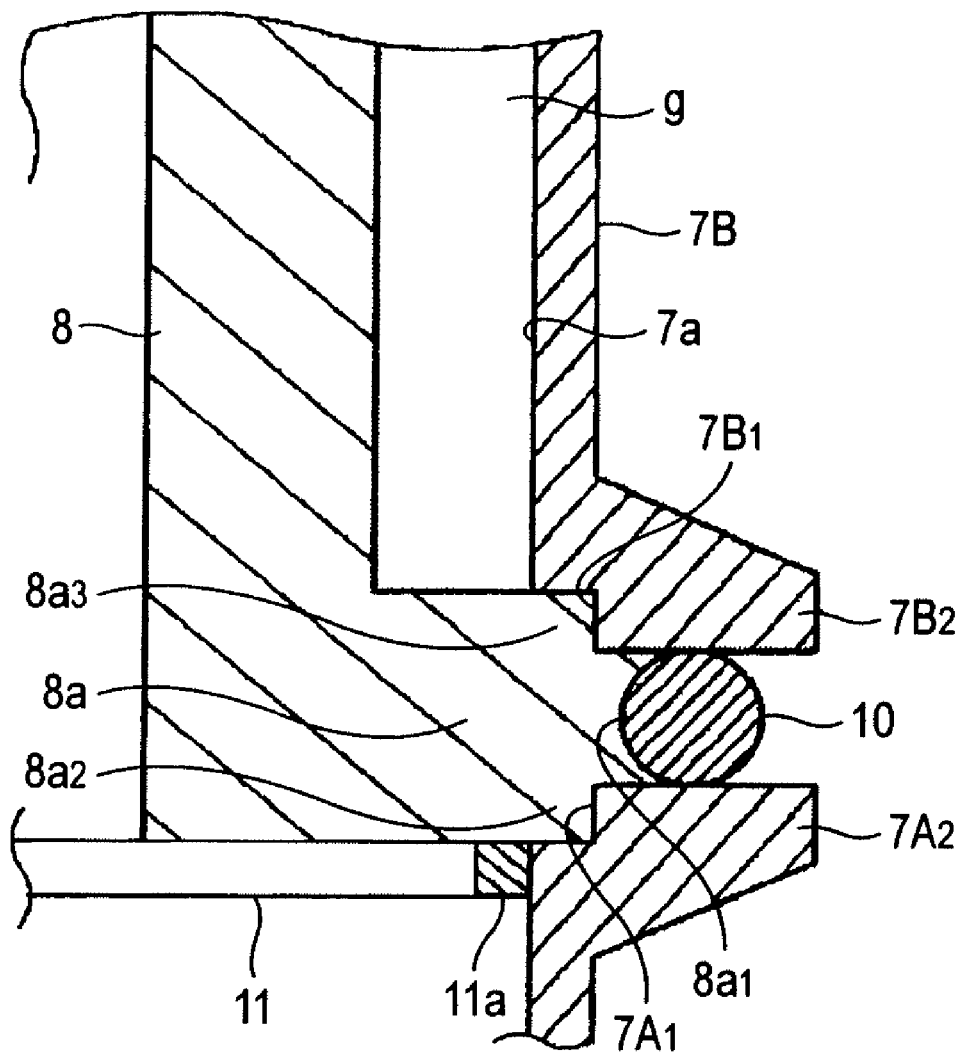
FIG. 4 is an enlarged view of part "A" in FIG. 2.

As shown in FIG. 4, the inorganic porous body 8 is attached airtightly to the slow exhaust passage 7 in a following manner.

An O-ring 10 is fitted to an outer circumferential portion of the flange 8a. A ring-shaped engagement recess 7A1 provided in a lower slow exhaust passage 7A and a lower ring-shaped engagement projection 8a1 are engaged each other. The inorganic porous body 8 is erected on the lower slow exhaust passage 7A. An upper slow exhaust passage 7B is outwardly fitted to the inorganic porous body 8 from upper side while forming a gap "g" therebetween. A ring-shaped engagement recess 7B1 provided in the upper slow exhaust passage 7B and an upper ring-shaped engagement projection 8a2 provided in the flange 8a are engaged each other.

According to this configuration, a lower flange 7A2 provided in the lower slow exhaust passage 7A and an upper flange 7B2 provided in the upper slow exhaust passage 7B cooperate to hold the flange 8a and the O-ring 10 is urged.

As described above, because the inorganic porous body 8 is attached to the slow exhaust passage 7 via the gas-nontransmissive ring-shaped flange 8a which is made of the same material as the inorganic porous body 8, the inorganic porous body 8 is attached easily and reliably without being damaged. Since the inorganic porous body 8 can be attached without modifying the structure of the conventional decompression apparatus to a large extent, a decompression apparatus can be provided within low cost.

The lower slow exhaust passage 7A and the upper slow exhaust passage 7B are held integrally by a clamp (not shown). A wire gauze 11 is provided on the opening portion side of the inorganic porous body 8. The wire gauze is stretched inside a ring-shaped attachment member 11a, has smaller pore diameters than the inorganic porous body 8 and highly air permeability.

With this structure, for example, even if the inorganic porous body 8 is damaged, resulting fragments of the damaged inorganic porous body 8 can be prevented from flowing toward the vacuum pump 4.

Examples of the inorganic material other than silica are SiC and alumina. Among them, silica is preferable from the viewpoints of heat resistance, corrosion resistance, etc.

The porous body may be an ordinary porous body of which voids having substantially the same volume are continuously connected each other. The porous body also may be a porous body having a 3D mesh-like skeletal structure formed so that adjoining plural spherical pores are connected to each other via communication holes.

In the former porous body, it is preferable that the material is silica glass, and the preferable average pore diameter and the preferable porosity is 10 to 50 μm and 20 to 40%, respectively.

In the latter porous body, it is preferable that the material is SiC and that the preferable average pore diameter, the communication hole diameter, and the porosity is 30 to 90 μm, 10 to 20 μm, and 55 to 65%, respectively.

Next, operations of the decompression apparatus 1 and the inorganic porous body 8 used therein according to the first embodiment will be described.

Referring to FIG. 1, to decompress the vacuum chamber 2 (processing chamber), at a start of the decompression, the vacuum pump 4 is caused to operate in a state that the first valve 6 in the main exhaust passage 5 and the second valve 9 in the slow exhaust passage 7 are closed and then, the second valve 9 is opened.

When the second valve 9 is opened, the gas in the vacuum chamber 2 flows to the vacuum pump 9 via the slow exhaust passage 7, the gap g, the inorganic porous body 8 and the second valve 9. Thus, the vacuum chamber 2 is decompressed.

In this decompressing process, abrupt decompression in the vacuum chamber 2 and stirring-up of particles are prevented. Because the inner diameter of the slow exhaust passage 7 is 100 mm and the outer diameter and proper gas flow resistance is set such that the average pore diameter and the porosity of the inorganic porous body 8 to be 60 to 80 mm, 10 to 100 μm, and 20 to 40%, respectively. Furthermore, since the gas passes through the inorganic porous body 8 having a large surface area and being a bottomed cylindrical shape via the gap "g", the decompression can be performed quickly.

As described above, the first embodiment can realize a decompression apparatus which is inexpensive, provides a high exhaust rate, and can prevent stirring-up of particles.

Next, a decompression apparatus and an inorganic porous body used therein according to a second embodiment of the invention will be described.

Whereas the first embodiment employs the inorganic porous body 8 of the bottomed cylindrical shape, the second embodiment employs an inorganic porous body of non-bottomed cylindrical shape.

Figure 5:
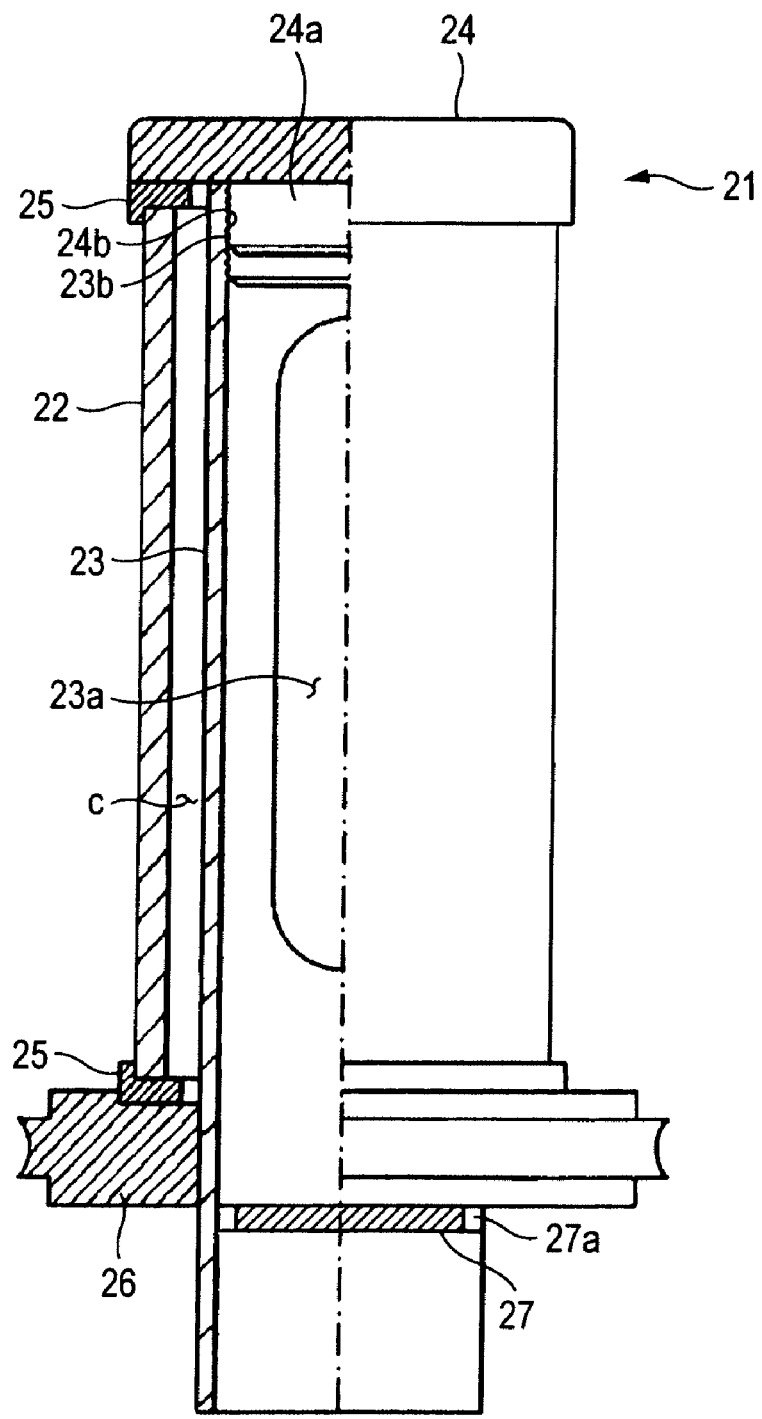
FIG. 5 is a vertical sectional view of an inorganic porous body unit which is used in a decompression apparatus according to a second embodiment of the invention.

For example, as shown in FIG. 5, the decompression apparatus according to the second embodiment has the same vacuum chamber and exhaust mechanism (excluding the inorganic porous body) as shown in FIG. 1 and a porous body unit 21 is disposed in the slow exhaust passage 7.

The porous body unit 21 has:

an inorganic porous body 22 of a non-bottomed cylindrical shape;

a hollow metallic vent pipe 23 which outwardly fits to the inorganic porous body 22 with a gap "c" and is formed with vent holes 23a on a circumferential wall thereof;

a closing member 24 which closes one end of the inorganic porous body 22 and one end of the metallic vent pipe 23;

two soft gaskets 25, 25 which are made of polytetrafluoroethylene (PTFE) and press both ends of the inorganic porous body 22 and a metallic attachment ring 26 through which the metallic vent pipe 23 penetrates and to which the other end portion of the metallic vent pipe 23 is welded airtightly.

The porous body unit 21 is assembled by threadedly engaging a male screw 24b formed on the outer circumferential surface of a disc-shaped attachment projection 24a of the closing member 24 with a female screw 23b formed on the inside surface of the one end portion of the metallic vent pipe 23 and thereby pressing the two gaskets 25, 25 toward the inorganic porous body 22 by the closing member 24 and the metallic attachment ring 26.

The porous body unit 21 is attached airtightly to the slow exhaust passage 7 in the same manner as in the first embodiment.

A wire gauze 27 is provided on the opening portion side of the inorganic porous body 22. The wire gauze 27 is stretched inside a ring-shaped attachment member 27a, has smaller pore diameters than the inorganic porous body 22 and is high in air permeability.

Therefore, the second embodiment can realize a decompression apparatus which is inexpensive, provides a high exhaust rate, and can prevent stirring-up of particles.

The other part of the configuration will be omitted because its configurations are the same as that of the decompression apparatus 1 of FIG. 1.

EXAMPLES

Examples 1 through 4

A decompression apparatus (Example 1) according to the first embodiment of the invention was produced, which is incorporated a porous body, in which a flange made of dense silica glass and having height of 15 mm, outer diameter of 50 mm and inner diameter of 24 mm, was engaged with a normal silica porous body of which voids having substantially the same volume each other are continuously connected each other. The normal silica porous body has height of 80 mm, outer diameter of 30 mm, inner diameter 24 mm, average pore diameter of 16 μm and porosity of 30% and of which shape is the same as that shown in FIG. 3.

Slow exhaust tests were conducted and decompression speeds and manners of particle generation were examined by using the decompression apparatus of Example 1 and a decompression apparatus of Comparative Example 1 which did not incorporate the above-described porous body.

[Test 1]

Eight hundred pieces of foam polystyrene (0.0009 g/piece) were placed on a disc-shaped tray in the vacuum chamber having a capacity of 65 L at a position apart from the exhaust opening by 40 mm. The vacuum chamber was vacuum-evacuated by the vacuum pump having a maximum exhaust ability of 7,000 L/min. Slow exhausting was performed from a start of the vacuum evacuation and the decompression speed and movement of the foam polystyrene powder were examined.

Figure 6:
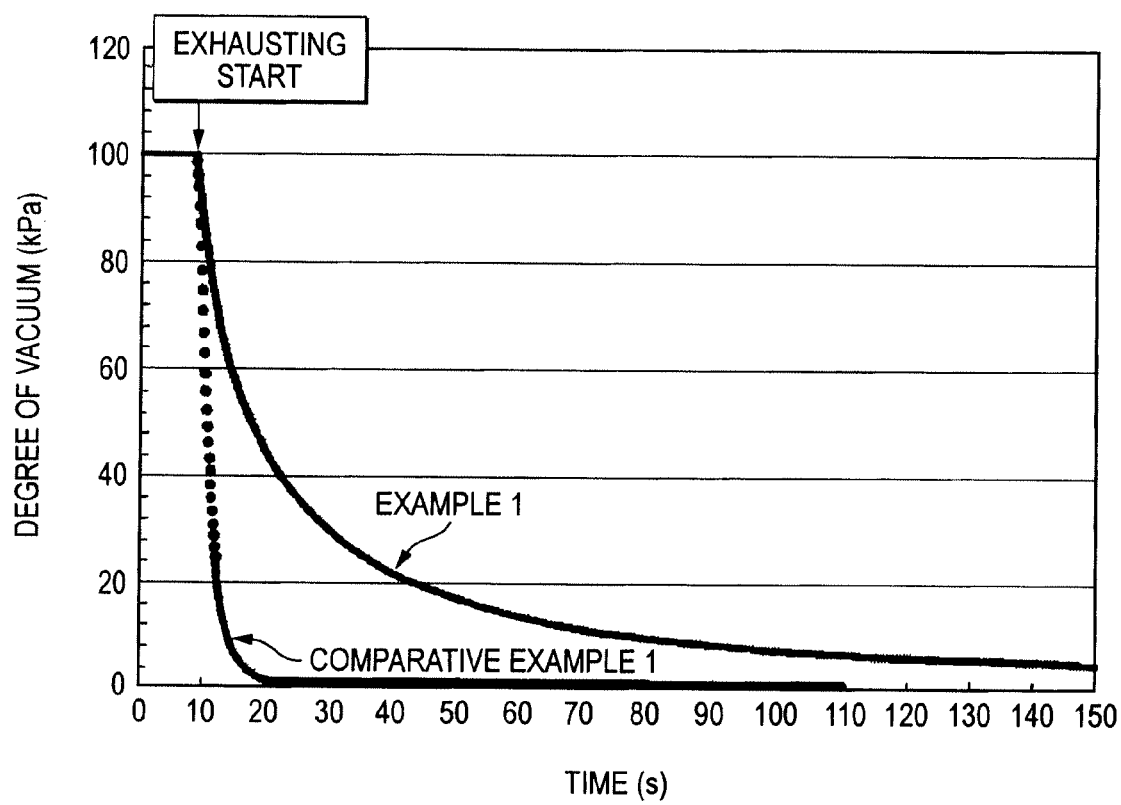
FIG. 6 shows a result of a slow exhaust test that was conducted by using a decompression apparatus according to the first embodiment of the invention.

Results are shown in FIG. 6.

The exhaust time of Example 1 was much longer than that of Comparative Example 1. However, whereas 600 to 700 pieces of foam polystyrene fell from the tray to the bottom of the vacuum chamber in Comparative Example 1, no piece of foam polystyrene fell in Example 1.

[Test 2]

In order to shorten the exhaust time of the decompression apparatus according to the invention, exhausting with the first valve of the main exhaust passage opened and exhausting with only the second valve of the slow exhaust passage opened were combined. The time taken to decompress from atmospheric pressure to 1 kPa in a state that the number of pieces of foam polystyrene falling from the tray was kept small was examined and compared with that of the decompression apparatus without an inorganic porous body.

Figure 7:
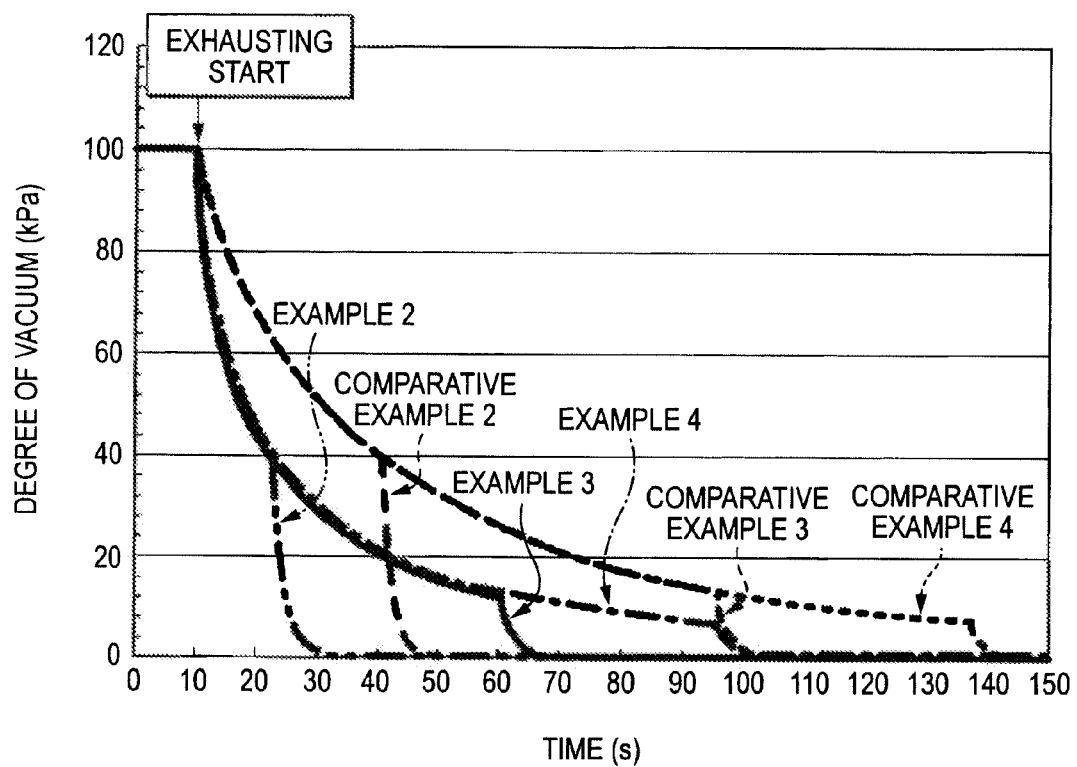
FIG. 7 shows results of slow exhaust tests that were conducted by using a decompression apparatus according to the first embodiment of the invention.
Figure 8:
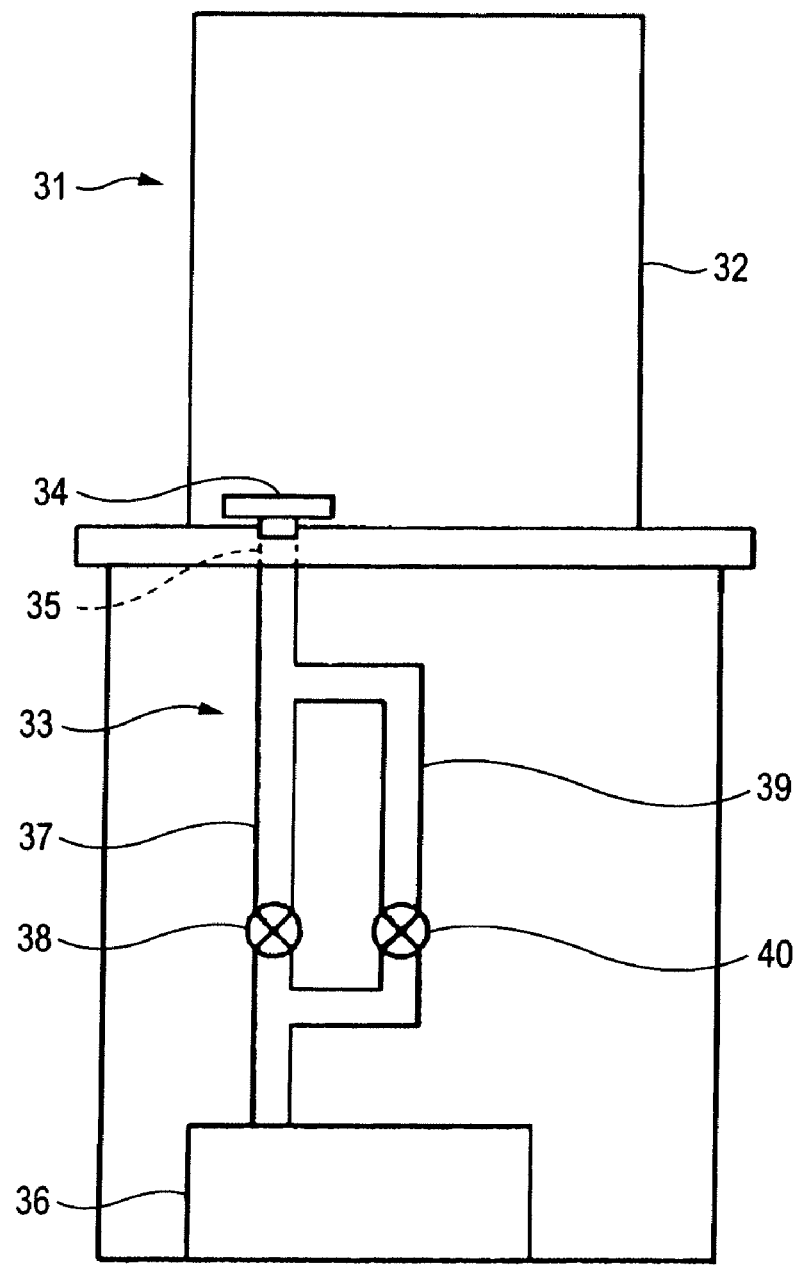
FIG. 8 is a conceptual diagram of a conventional decompression apparatus.
Figure 9:
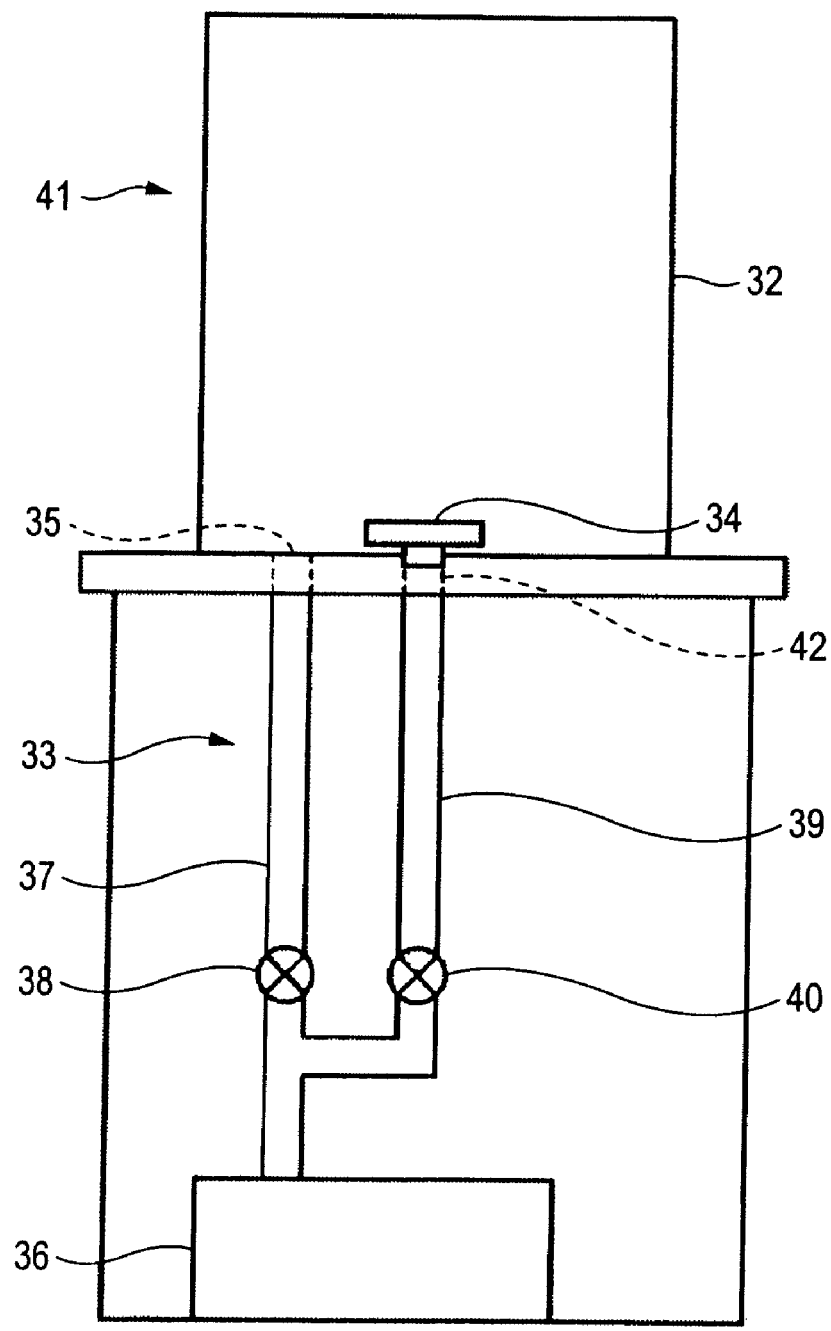
FIG. 9 is a conceptual diagram of another conventional decompression apparatus.

Results are shown in Table 1 and FIG. 7.

TABLE 1

| | Vacuum chamber pressure at the time of opening of main valve (kPa) | Time taken to reach 1 kPa (s) | Time shortened (s) | Shortening ratio (%) |
|---|---|---|---|---|
| Example 2 | 40 | 22 | 16 | 42 |
| Comparative Example 2 | | 38 | | |
| Example 3 | 13 | 56 | 34 | 38 |
| Comparative Example 3 | | 90 | | |
| Example 4 | 7 | 88 | 44 | 33 |
| Comparative Example 4 | | 132 | | |

As seen from Table 1 and FIG. 7, in Example 2 in which the vacuum chamber pressure at the time of opening of the main valve was 40 kPa, the time taken to reach 1 kPa was shortened to 22 s which was 42% (16 s) shorter than 38 s of Comparative Example 2 in which the main valve was opened at the same pressure.

In Example 3 in which the vacuum chamber pressure at the time of opening of the main valve was 13 kPa, it was found that the time taken to reach 1 kPa was shortened to 56 s which was 38% (34 s) shorter than 90 s of Comparative Example 3 in which the main valve was opened at the same pressure.

In Example 4 in which the vacuum chamber pressure at the time of opening of the main valve was 7 kPa, it was found that the time taken to reach 1 kPa was shortened to 88 s which was 33% (44 s) shorter than 132 s of Comparative Example 4 in which the main valve was opened at the same pressure.

Example 5

A porous body having a 3D mesh-like skeletal structure was incorporated in a decompression apparatus and a manner of stirring-up of particles was examined by the same method as in the test 1.

Porous body samples were manufactured by the following method.

Foamed slurry was prepared by mixing and agitating, with an agitator, 100 parts by weight of an SiC powder having average particle diameter of 0.5 μm, 45 parts by weight of an ion-exchanged water as a liquid medium, 1 part by weight of triethanol amine lauryl sulfate as a foaming agent, 1 part by weight of carbon black and 0.2 part by weight of a B4C powder having average particle diameter of 1.4 μm as sintering assistant agents, and 5 parts by weight of polyethyleneimine as a primary gelling agent while introducing air for foaming.

Then, while the foamed slurry was agitated, 1 part by weight of an epoxy resin as an auxiliary gelling agent was added thereto. Resulting slurry was poured into a mold and left for 3 hours, whereby gelation proceeded sufficiently. A resulting material was taken out of the mold and dried at 60° C. for several days. A cylindrical formed body (dried body) was thus obtained.

The formed body was heated at 1,780° C. for 1 hour in an Ar gas atmosphere (temporally calcined) and then calcined at 2,100° C. for 1 hour in the same atmosphere. Thus, a cylindrical SiC porous body having a 3D mesh-like skeletal structure in which adjoining plural spherical pores were connected to each other via communication holes was obtained.

This SiC porous body was 80 mm in height, 30 mm in outer diameter, 24 mm in inner diameter, 80 μm in average pore diameter, 10 to 20 μm in communication hole diameter, and 60% in porosity. A gas-nonpermissive ring-shaped flange which was 15 mm in height, 50 mm in outer diameter, and 24 mm in inner diameter and was made of the same material as the SiC porous body was integrated with the SiC porous body.

Example 5 in which a decompression apparatus according to the first embodiment of the invention incorporating the above-described SiC porous body was used was evaluated under the same conditions as in the above-described test 1. The exhaust time was equivalent to that of Comparative Example 5 in which a decompression apparatus without an inorganic porous body was used. The number of pieces of foam polystyrene falling from the tray to the bottom of the vacuum chamber was zero whereas it was 660 in Comparative Example 5.

As described above, according to the decompression apparatus according to the present invention, by performing the slow exhausting at initial stage where stirring up of the particles is easily occurred, and then exhausting via the main exhaust passage under low pressure state where the stirring up of the particles is suppressed, quick decompression can be realized.

This application claims priority from Japanese Patent Application No. 2007-190462, filed Jul. 23, 2007 and Japanese Patent Application No. 2007-279283 filed Oct. 26, 2007, which are incorporated herein by reference in their entirety.

What is claimed is:

1. A decompression apparatus comprising:
   a vacuum chamber and
   an exhaust mechanism which decompresses the vacuum chamber and comprising:
   a main exhaust passage one end of which is connected to the vacuum chamber and the other end of which is connected to a vacuum pump;
   a first valve provided in the main exhaust passage;
   a slow exhaust passage one end of which is connected to the vacuum chamber directly or via the main exhaust passage and the other end of which is connected to the vacuum pump directly or via the main exhaust passage;
   a cylindrical inorganic porous body provided in the slow exhaust passage so that a first gap is formed between the inorganic porous body and an inner surface of the slow exhaust passage; and
   a second valve provided in the slow exhaust passage
   wherein,
   the inorganic porous body is non-bottomed cylindrical shape having opening at both ends,
   a hollow metallic vent passage having a vent hole on circumferential wall thereof is provided inside the inorganic porous body so that a second gap is formed between an inside surface of the inorganic porous body and an outer circumferential surface of the metallic vent passage,
   one end portion of the metallic vent passage is closed by a closing member which is threadedly engaged with the one end portion of the metallic vent passage,
   one end of the inorganic porous body is pressed and closed by the closing member via a first soft gasket,
   the other end portion of the metallic vent passage penetrates through a metallic attachment ring in air-tight manner and
   the other end of the inorganic porous body is pressed by the metallic attachment ring via a second soft gasket.

2. The decompression apparatus according to claim 1, wherein,
   the closing member is provided at upstream side and
   the second valve is provided at downstream side of the slow exhaust passage relative to the inorganic porous body.

3. The decompression apparatus according to claim 1, wherein, the inorganic porous body is a silica porous body.

4. The decompression apparatus according to claim 1, wherein, the inorganic porous body is a SiC porous body.

5. A cylindrical inorganic porous body which is disposed in an exhaust mechanism, for decompressing a vacuum chamber, of a decompression apparatus, the apparatus comprising:
   a vacuum chamber and
   an exhaust mechanism which decompresses the vacuum chamber and comprising:
   a main exhaust passage one end of which is connected to the vacuum chamber and the other end of which is connected to a vacuum pump;
   a first valve provided in the main exhaust passage;
   a slow exhaust passage one end of which is connected to the vacuum chamber directly or via the main exhaust passage and the other end of which is connected to the vacuum pump directly or via the main exhaust passage;
   a cylindrical inorganic porous body provided in the slow exhaust passage so that a first gap is formed between the inorganic porous body and an inner surface of the slow exhaust passage; and
   a second valve provided in the slow exhaust passage
   wherein,
   the inorganic porous body is non-bottomed cylindrical shape having opening at both ends,
   a hollow metallic vent passage having a vent hole on circumferential wall thereof is provided inside the inorganic porous body so that a second gap is formed between an inside surface of the inorganic porous body and an outer circumferential surface of the metallic vent passage, one end portion of the metallic vent passage is closed by a closing member which is threadedly engaged with the one end portion of the metallic vent passage, one end of the inorganic porous body is pressed and closed by the closing member via a first soft gasket, the other end portion of the metallic vent passage penetrates through a metallic attachment ring in air-tight manner and the other end of the inorganic porous body is pressed by the metallic attachment ring via a second soft gasket.

6. The inorganic porous body according to claim 5, wherein the inorganic porous body is a silica porous body.

* * * * *